United States Patent [19]

Fujie et al.

[11] 3,735,203

[45] May 22, 1973

[54] PROTECTIVE CIRCUIT

[75] Inventors: Seijiro Fujie, Yokohama; Yoshifumi Saeki, Tokyo, both of Japan

[73] Assignee: Pioneer Electronic Corporation, Tokyo, Japan

[21] Appl. No.: 199,182

[30] Foreign Application Priority Data

Nov. 16, 1970 Japan ............................45/113494

[52] U.S. Cl. ............317/27 R, 317/33 R, 330/207 P, 307/202

[51] Int. Cl. ............................................H02h 3/28

[58] Field of Search ..................330/207 P, 51, 30 D; 307/202, 235; 317/27 R, 33 R, 33 SC, 33 VR, 12 R, 12 A, 12 B; 323/DIG. 1; 340/248 A, 248 E, 248 F, 253 A, 253 H, 253 N

[56] References Cited

UNITED STATES PATENTS

| | | | |
|---|---|---|---|
| 3,250,981 | 5/1966 | Marks | 317/33 VR |
| 3,219,911 | 11/1965 | Burfeindt | 307/202 X |
| 3,497,794 | 2/1970 | Frederickson | 323/DIG. 1 |
| 3,058,036 | 10/1962 | Reuther | 317/33 X |
| 3,486,128 | 12/1969 | Lohrmann | 330/40 |

*Primary Examiner*—J. D. Miller
*Assistant Examiner*—Harvey Fendelman
*Attorney*—Richard C. Sughrue, Gideon Franklin Rothwell, John H. Mion et al.

[57] ABSTRACT

A protective circuit for protecting an output circuit and a load circuit of a signal amplifier from abnormal conditions, and including a differential amplifier for detecting the abnormal conditions, and a sensitivity control circuit for reducing the amplification factor of the differential amplifier for the input signal so that the output signal of the signal amplifier is clipped.

3 Claims, 1 Drawing Figure

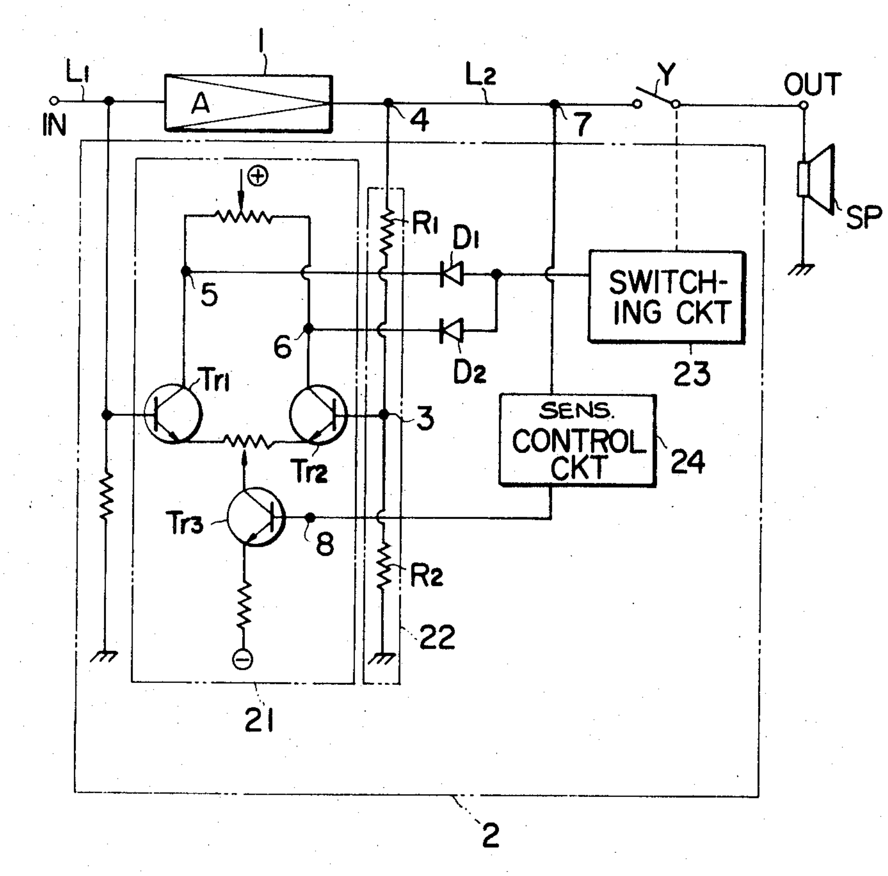
INVENTORS
SEIJIRO FUJIE
YOSHIFUMI SAEKI
BY Sughrue, Rothwell, Mion, Zinn & Macpeak
ATTORNEYS

PROTECTIVE CIRCUIT

BACKGROUND OF THE INVENTION

1. Field of the Invention

This invention relates to a protective circuit for protecting an output circuit and/or a load circuit of a signal amplifier from abnormal conditions, and, more particularly, to a protective circuit useful for protecting an output-condenser-less (O.C.L.) amplifier.

2. Description of the Prior Art

In the prior art, most of the audio amplifiers have been output-transformer-less (O.T.L.) amplifiers. However, as an amplifier having better performance was urgently required, it was recognized that the output condenser of an O.T.L. amplifier adversely affects the output signal. An O.T.L. amplifier without an output transformer and having two power sources, and called an output-condenser-less (O.C.L.) amplifier, has attracted notice recently. In this O.C.L. amplifier, an output terminal is directly connected to a load circuit without being coupled through an output condenser. When the D.C. voltage level of the output signal line varies, a direct current in accordance with the variation of DC voltage flows in the load circuit. As a result, the load circuit, such as a loudspeaker, etc., is broken down by the direct current at times, and active electrical devices of an output stage, for example, output transistors, are broken down in the event of a short in the load circuit at other times. The O.C.L. amplifier needs greater care than an O.T.L. amplifier having the output condenser in respect of providing protection for the amplifier and its load circuit.

SUMMARY OF THE INVENTION

The present invention has been made to correct the afore-mentioned defects.

One object of the invention is to provide a protective circuit for securely protecting an output circuit and/or a load circuit from abnormal conditions, such as a short in a load circuit and a variation of a D.C. voltage in the circuit.

Another object of the invention is to provide a protective circuit which never reduces the safety operating range of a signal amplifier, in which range the amplifier operates originally, because of the addition of the protective circuit to the amplifier.

A further object of the invention is to provide a protective circuit particularly useful for an O.C.L. amplifier.

Other objects, advantages and features of the present invention will become apparent from the following description taken in conjunction with the accompanying drawing.

BRIEF DESCRIPTION OF THE DRAWING

The single FIGURE is a circuit diagram showing one embodiment of a protective circuit in accordance with the present invention.

DESCRIPTION OF THE PREFERRED EMBODIMENT

One embodiment of this invention will be explained in accordance with the drawing.

An O.C.L. signal amplifier 1 has two power sources, that is, a positive power source (+) and a negative power source (−). An input terminal IN and an output terminal OUT are connected to the O.C.L. amplifier 1 via an input-signal line L1 and an output-signal line L2, respectively. These signal lines L1 and L2 are normally at ground potential with respect to a direct current. In this embodiment, the O.C.L. amplifier is designed to make the input signal equal to the output signal in phase. A loudspeaker SP is connected between the output terminal OUT and ground.

A protective circuit 2 for the amplifier 1 and the loudspeaker SP consists of a differential amplifier 21, an attenuator 22, a switching circuit 23, a sensitivity control circuit 24, and a switch contact *y*. The differential amplifier 21 includes transistors Tr1, Tr2 and Tr3. The base electrodes of the transistors Tr1 and Tr2 are connected to the input-signal line L1 and an output terminal of the attenuator 22, respectively. The transistor Tr3, the collector of which is connected to both of the emitters of the transistors Tr1 and Tr2, constitutes a constant-current circuit. Both the transistors Tr1 and Tr2 are normally in a balanced state.

The attenuator 22 has an attenuation factor of the same magnitude as the amplification factor of the amplifier 1. An input terminal 4 and output terminal 3 of the attenuator are connected to the output-signal line L2 and the base electrode of the transistor Tr2, respectively. In this embodiment, the attenuator 22 is constituted by resistors R1 and R2.

The normally unoperated switching circuit 23 is connected to the output terminals 5 and 6 of the differential amplifier 21 via diodes D1 and D2, and is operative to open the switch contact *y* in the output-signal line L2 when either output voltage of the differential amplifier 21 becomes lower than a predetermined voltage. In addition, in this embodiment the switching circuit 23 is designed so as to hold the contact *y* in the opened state for a few seconds after the contact *y* has been opened.

The sensitivity control circuit 24 has an input terminal 7 and an output terminal 8 connected to the output signal line L2 and the base of the transistor Tr3, respectively; and when the output voltage or current of the signal amplifier 1 becomes higher than a pre-selected voltage or current, the output current of the sensitivity control circuit 24 decreases to a certain current value, and the amplification factor of the differential amplifier 21 is thereby reduced.

Next, the operation of the protective circuit will be explained. Normally, the base electrodes of the transistor Tr1 and Tr2 are at ground potential, the differential amplifier 21 is in a balanced state, and, therefore, the switching circuit 23 is not operated, and contact *y* is closed.

In this state, when a signal is applied to the input terminal IN, part of the signal is applied to the O.C.L. amplifier 1, and another part is applied to the base electrode of the transistor Tr1 in the differential amplifier 2. The signal applied to the amplifier 1 is amplified by a settled amplification factor; part of the amplified signal drives the loudspeaker SP via the closed contact *y*, and another part is applied to the attenuator 22. The applied signal is attenuated by an attenuation factor of the same magnitude as the amplification factor of the amplifier 1, and is applied to the base electrode of the transistor Tr2 via terminal 3. Since both the signals fed to the bases of the transistors Tr1 and Tr2 are in the same phase and of the same magnitude, the differential amplifier 21 remains in the balanced state.

On the other hand, when the D.C. potential of the output-signal line L2 varies due to some disorder of the amplifier 1, the base voltage of the transistor Tr2 varies in accordance with the variation of the D.C. potential of the output signal line L2. Consequently, the differential amplifier 21 goes into the unbalanced state to produce at one of its outputs a control signal which operates the switching circuit 23. By the operation of the switching circuit 23, the contact *y* is opened, and the load circuit, that is, the loudspeaker SP, is thus protected from the disorder of the amplifier 1.

Moreover, when the terminals of the loudspeaker SP are short-circuited due to some cause, an A.C. signal does not appear on the output-signal line L2. Consequently, the differential amplifier 21 goes into the unbalanced state; then, as described above, by the operation of the switching circuit 23, the contact *y* is opened, and the amplifier is thus protected securely from the disorder of the load circuit. In addition, the switching circuit 23 returns to its original unoperated state after a few seconds, thereby reclosing contact *y*. At this time, if the differential amplifier 21 remains still in the unbalanced state, the contact *y* is opened again; consequently, the amplifier 1 or loudspeaker SP is again securely protected from the disorder.

When the input signal is so excessive that the output signal from the signal amplifier 1 is clipped, and if the differential amplifier 21 is very sensitive to the input signals, then the differential amplifier 21 should go to the unbalanced state. By the operation of the sensitivity control circuit 24, however, when the output voltage or current of the signal amplifier 1 becomes higher than the preselected voltage or current, the output current of the sensitivity control circuit 24 decreases to a certain current value and the sensitivity of the differential amplifier 21 is reduced. Consequently, even if there is a potential difference between the input signals fed to the differential amplifier at the base electrodes of transistors Tr1 and Tr2, the differential amplifier is still retained in the balanced state, and the loudspeaker SP is driven as before.

In the one embodiment described above, the attenuator having an attenuation factor of the same magnitude as the amplification factor of the amplifier 1 is used to equate the input voltages at both of the input terminals of the differential amplifier 1 under normal conditions. This invention is not, however, limited to this embodiment alone. Another object of this invention is to broadly protect the amplifier or the load by using the output of the differential amplifier. This invention is not limited at all as to the way in which this output is used. That is, the controlling circuit is not limited by this example, but may be a well-known circuit which is operated by the output of the abnormal condition detecting circuit to protect the amplifier or the load. For example, the source may be opened by the controlling circuit and the contact *y* in the output line is not necessarily required.

Further, in the one embodiment described above, the input terminal 7 of the sensitivity control circuit 24 is connected to the output signal line L2. The input terminal of the sensitivity control circuit may be connected, however, to any signal line of the amplifier.

The protective circuit according to the present invention, as set forth above, is operated when the differential amplifier goes into the unbalanced state due to some disorders; consequently, the amplifier and/or its load circuit is protected securely from an overload and/or from a variation of the D.C. voltage of the amplifier.

While the invention has been particularly shown and described with reference to the preferred embodiment thereof, it will be understood by those skilled in the art that various changes in form and details may be made therein without departing from the spirit and scope of the invention.

We claim:

1. A protective circuit for protecting an output stage of an input signal amplifier comprising:

a. a normally balanced differential amplifier having a first input coupled to the input of, and a second input coupled to the output of, said signal amplifier, said differential amplifier being responsive to an abnormal condition of said signal amplifier to go into an unbalanced state to produce a control signal at its output, b. normally unoperated switching means connected to the output of said differential amplifier and operative to protect the output stage of said signal amplifier from abnormal conditions, said switching means being operated by said control signal when said differential amplifier goes into an unbalanced state, c. a sensitivity control circuit for reducing the amplification factor of said differential amplifier for the input signal of said signal amplifier when the output signal of said signal amplifier is clipped, and d. an attenuation circuit having an input connected to said output of said signal amplifier and having an output connected to said second input of said differential amplifier, said attenuation circuit having an attenuation factor of the same magnitude as the amplification factor of said signal amplifier.

2. A protective circuit as set forth in claim 1, wherein said switching means comprises a switching having a switch contact in the output of said signal amplifier.

3. A protective circuit as set forth in claim 1, wherein said signal amplifier is an output-condenser-less amplifier.

* * * * *